United States Patent [19]

Harada et al.

[11] Patent Number: 5,143,896
[45] Date of Patent: Sep. 1, 1992

[54] PROCESS AND SYSTEM FOR PREPARING A SUPERCONDUCTING THIN FILM OF OXIDE

[75] Inventors: Keizo Harada; Hideo Itozaki; Shuji Yazu, all of Hyogo, Japan

[73] Assignee: Sumitomo Electric Industries, Ltd., Osaka, Japan

[21] Appl. No.: 604,896

[22] Filed: Oct. 31, 1990

[30] Foreign Application Priority Data

| Oct. 31, 1989 | [JP] | Japan | 1-284357 |
| Oct. 31, 1989 | [JP] | Japan | 1-284358 |
| Oct. 31, 1989 | [JP] | Japan | 1-284359 |
| Oct. 31, 1989 | [JP] | Japan | 1-284360 |

[51] Int. Cl.$^5$ .......................................... C23C 14/24
[52] U.S. Cl. ........................ 505/1; 118/665; 118/708; 118/712; 118/715; 118/725; 505/819
[58] Field of Search ............. 118/715, 725, 665, 708, 118/712; 505/819

[56] References Cited

PUBLICATIONS

Kwo et al, Appl. Phys. Lett. 53(26) Dec. 26, 1988, pp. 2683–2685.
Webb et al, Appl. Phys. Lett. 51(15) Oct. 12, 1987, pp. 1191–1193.
Schlom et al, Appl. Phys. Lett. 53(17) Oct. 24, 1988, pp. 1660–1662.
Eckstein et al. J. Vac. Sci. Technol. B7(2) Mar./Apr. 1989, pp. 319–323.
Schlom et al, MRS Extended Abstracts: High–Temp Superconductors II pp. 197–200, Aug. 1, 1989.
*Japanese Journal of Applied Physics*, vol. 28, No. 10, Nakayama et al, "Epitaxial growth of Bi–Sr–Ca–Cu–O thin films by molecular beam epitaxy technique with shutter control," pp. 1809–1811 (Oct. 1989).
*Journal of Vacuum Sci. and Tech.: Part B*, vol. 7, No. 2, Eckstein et al, "Epitaxial growth of high–temperature superconducting thin films," pp. 319–323 (Mar. 1989).
*Journal of Crystal Growth*, vol. 95, No. 1–4, Harris et al, "MBE growth of high critical temperature superconductors," pp. 607–616 (Feb. 11, 1989).
*Journal of Crystal Growth*, vol. 102, No. 3, Schlom et al, "Molecular beam epitaxial growth of layered Bi–Sr–Ca–Cu–O compounds," pp. 361–375 (May 1990).

*Primary Examiner*—Richard Bueker
*Attorney, Agent, or Firm*—Kerkam, Stowell, Kondracki & Clarke

[57] ABSTRACT

In a process for preparing a thin film of oxide superconductor having a layered crystal structure by depositing each layer of said layered crystal structure on a substrate by Molecular Beam Epitaxy (MBE) method with introducing oxygen-containing gas which is exited by irradiation of microwave, improvement in that a film-forming operation by the MBE method is interrupted temporally after predetermined numbers of constituent layers which correspond to one unit crystal or less than one unit crystal are layered so that the deposited constituent layers are left in an activated oxygen atmosphere to effect a crystallization promotive operation, before next film-forming operation is restarted.

8 Claims, 1 Drawing Sheet

PROCESS AND SYSTEM FOR PREPARING A SUPERCONDUCTING THIN FILM OF OXIDE

BACKGROUND OF THE INVENTION

1. Field of the Invention

The present invention relates to a process for preparing a superconducting thin film of oxide, more particularly, to an improved process for depositing a thin film of superconducting compound oxide on a substrate by Molecular Beam Epitaxy (hereinafter, MBE) technique.

The present invention relates also to a system for carrying out the process automatically by a computer.

2. Description of the Related Art

Thin films of compounds are prepared by so-called reaction-evaporation method in which materials are evaporated in an active gas atmosphere so that vapors of the materials are reacted with the active gas on a substrate to deposit a thin film of the compound on the substrate. When the compound is an oxide, oxygen is usually used as the active gas. In Tatsumi et al. "Epitaxial film growth of artificial (Bi-O)/(Sr-Ca-Cu-O) layered structure", Appl. Phys. Lett. 54 (23) Jun. 5, 1989 p. 2364–2366, an oxide superconducting thin film of Bi-Sr-Ca-Cu-O system is grown epitaxially by ion-beam sputtering technique in the presence of oxygen gas. It is also proposed to use exited oxygen which is activated by microwave in order to obtain an oxide thin film of high quality.

Thin films of compounds composed of more than two elements are advantageously prepared by the MBE technique in which proportions of constituent elements of the compound can be controlled precisely. A combination of the MBE and the reaction-evaporation is much effective for some compounds. D. G. Schlom et al. "Molecular beam epitaxy of layered Dy-Ba-Cu-O compounds", Appl. Phys. Lett. 53 (17) Oct. 24, 1988, p 1660–1662 disclose a modified MBE process in which a thin film of oxide superconductor of Dy-Ba-Cu-O is prepared with introducing excited oxygen gas which is activated by microwave.

In a high-temperature superconductor possessing a layered perovskite crystalline structure composed of constituent layers each containing different elements, the constituent layers are stratified successively on a substrate. Superconductive property of a final product is influenced critically by the content of oxygen atoms in constituent layers. Therefore, it is extremely important to control supply of oxygen gas to each constituent layer. In fact, it is difficult to obtain a desired crystal structure of high-temperature oxide superconductor by the known modified MBE process in which constituent layers are deposited continuously without controlling the oxygen supply, so that the quality of the final product obtained by the known modified MBE is rather poor.

An object of the present invention is to solve the problem and to provide an improved MBE process for preparing thin films of oxide superconductors of high quality and a system for carrying out the process automatically by a computer.

SUMMARY OF THE INVENTION

The present invention provides a process for preparing a thin film of oxide superconductor having a layered crystal structure by depositing constituent layers of said layered crystal structure on a substrate by Molecular Beam Epitaxy (MBE) method while an oxygen-containing gas which is exited by irradiation of microwave is introduced in the neighborhood of a surface of the substrate, characterized in that, after predetermined numbers of constituent layers which correspond to one unit crystal or less than one unit crystal are layered, a film-forming operation by the MBE method is interrupted temporally and the deposited constituent layers are maintained in an activated oxygen atmosphere in order to effect a crystallization promotive operation and then next film-forming operation by the MBE method is restrated after completion of said crystallization promotive operation, a combination of the film-forming operation and the crystallization promotion operation being repeated for desired times until a desired film thickness is obtained.

In the process according to the present invention, relative displacement of atoms in the crystal is promoted or accelerated in a stage of the crystallization promotion operation and satisfactory amount of oxygen is supplied to deposited layers, so that freshly deposited constituent layers are rearranged to a desired crystal structure which is indispensable to realizes a perfect superconductor. The thin film of the final product obtained by the process according to the present invention shows a very smooth surface of high quality whose crystallinity is improved. This advantage is difficulty obtained by the known process in which constituent layers are deposited continuously without interposing the crystallization promotive operation according to the present invention.

Numbers of constituent layers after deposition of which the film-forming operation by the MBE method should be interrupted temporally depend on kinds of oxides to be deposited. Generally, the crystallization promotion operation can be effected after numbers of constituent layers which correspond to one unit crystal are layered. When the crystal structure of an oxide to be deposited has such many constituent layers that are difficult to be controlled, the crystallization promotion operation may be effected after numbers of constituent layers which correspond to less than one unit crystal, for example a half of unit crystal, are layered.

The crystallization promotive operation can be carried out by maintaining the deposited constituent layers in an oxygen-containing atmosphere. Termination of this crystallization promotive operation can be detected by monitoring an output signal or a pattern of a film analyzer such as a reflection high energy electron diffraction (RHEED) analyzer which is used commonly in MBE machines. In fact, high-temperature oxide superconductors show specific modulated output patterns which are inherent to respective oxides in the RHEED analyzer, in other words, the quality of deposited thin films can be evaluated by the RHEED pattern. Therefore, the crystallization promotive operation can be terminated when a predetermined or desired output signal of the analyzer is observed. For example, in a case of $Y_1Ba_2Cu_3O_{7-z}$ whose crystal has a longer lattice constant along b-axis than along a-axis, the quality of its thin film can be evaluated by measuring spaces of streaks in the RHEED pattern. An oxide superconductor of $Bi_4Sr_4Ca_4Cu_6O_{16+\delta}$ shows a unique modulated RHEED pattern which can be used to determine termination of the crystallization promotive operation.

The process according to the present invention is applicable to any oxide superconductor which has a layered crystal structure as following:

$$(La_{1-x}\alpha_x)_2CuO_{4-y} \quad (1)$$

in which α stands for Sr or Ba, "x" and "y" are numbers each satisfying respective range of $0 \leq x < 1$ and $0 \leq y < 1$, $$La_1Ba_2Cu_3O_{7-z} \quad (2)$$

in which "Ln" stands for at least one element selected from the group comprising La, Ce, Pr, Nd, Sm, Eu, Gd, Tb, Dy, Ho, Y, Er, Tm, Yb and Lu and "z" is a number satisfying a range of $0 \leq z < 1$, and $$Bi_4(Sr_{1-k}Ca_k)_mCu_nO_{p+\delta} \quad (3)$$

in which "k", "m", "n", "p" and "δ" are numbers each satisfying respective range of $0 < k < 1$, $6 \leq m \leq 10$, $4 \leq n \leq 8$, $p = 6+m+n$ and $-2 \leq \delta \leq +2$.

In this oxide, following proportions are preferable:

$0.4 < k < 0.6$, $7 \leq m \leq 9, 5 \leq n \leq 7$ and $-2 \leq \delta \leq +2$, $0.2 < k < 0.4$, $6 \leq m \leq 7, 4 \leq n \leq 5$ and $-2 \leq \delta \leq +2$, and $0.5 < k < 0.7, 9 \leq m \leq 10, 7 \leq n \leq 8$ and $-2 \leq \delta \leq +2$.

This oxide can be represented by the following general formula:

$$Bi_2(Sr_{1-k}Ca_k)_{m/2}Cu_{n/2}O_{(p+\delta)/2}$$

because one unit crystal of the oxide is composed of two structures of this formula which are stratified symmetrically.

$$Bi_{2-q}Pb_qSr_2Ca_{r-1}Cu_rO_\gamma \quad (4)$$

in which "q", "r" and "γ" are numbers each satisfying respective range of $0.1 \leq q \leq 1$, $1 \leq r \leq 6$ and $6 \leq \gamma \leq 16$.

It is apparent that the process according to the present invention is applicable also to the other high-temperature oxide superconductors having a layered crystal structure such as Tl-containing oxide superconductors, no-copper containing oxide superconductors or the like.

The substrate used in the process according to the present invention has preferably the same or similar lattice constant as the oxide to be deposited and is preferably selected from single crystals oxides such as MgO, SrTiO₃, YSZ, LaGaO₃, LaGaO₃ and LaAlO₃. In a special case, a single crystal of silicon may be used. If desired, a buffer layer is interposed between the substrate and the thin film of superconducting oxide in order to prevent mutual migration of elements and/or to compensate mismatch in lattice constant. The thin film of superconducting oxide is preferably deposited on a predetermined plane of the substrate. In the case of single crystal oxide substrate of MgO and SrTiO₃, a {100} plane or a {110} plane is preferably used. The substrate is preferably heated during the operations of the process according to the invention at a temperature between 550° an 750° C.

The oxygen-containing gas is preferably pure oxygen gas which is exited by irradiation of microwave. This exited oxygen gas is supplied from straight nozzle(s) or ring nozzle(s) which is positioned in the neighborhood of a surface of the substrate where the nozzle doesn't intersect the beams of evaporated elements. A flow rate of exited oxygen gas depends on kinds of oxides to be deposited and/or capacity of evacuation pumps and can be determined by experiments. The flow rate of exited oxygen gas is usually selected between 0.1 and 50 SCCM.

The process according to the present invention can be carried out in a known modified MBE machine comprising a chamber in which a high vacuum can be created, means for introducting oxygen gas into the chamber, a microwave generator for exiting the oxygen gas, means for heating the substrate positioned in the chamber, means for controlling independently temperatures of evaporation sources, means for controlling independently shutters for evaporation sources, and an analyzer for monitoring crystal structures of thin films deposited on the substrate such as RHEED.

The process according to the present invention is preferably automated by using a computer, preferably a micro processor, connected to the known MBE machine. Therefore, the present invention provides a system for depositing a thin film of oxide superconductor having a layered crystal structure on a substrate by the above-mentioned molecular beam epitaxy (MBE) machine.

The system according to the present invention is characterized in that the crystallization promotive operation is controlled by a computer in such a manner that, during the crystallization promotive operation, output image signals from the analyzer for monitoring crystal structures of a thin film deposited on the substrate is compared with image data of a known superconducting oxide stored in a memory of the computer and that next film-forming operation is restarted after the output image signals from the analyzer become substantially identical with the image data stored in the memory.

The analyzer can be a reflection high-energy electron diffraction (RHEED) analyzer and the image data of known superconducting oxide stored in the memory of computer which is utilized in the crystallization promotive operation can be a modulated pattern of the RHEED analyzer which is inherent to the superconducting oxide. In practice, the output image signals from the RHEED analyzer are converted to digital image data in an image processor and the digital image data are compared with image data of known crystal structures of a superconducting oxide stored in a memory in the computer.

It is also possible to modify operational factors such as partial pressure of oxygen in the chamber and substrate temperature, if necessary, during the crystallization promotive operation.

In a preferred system according to the present invention, both of the film-forming operation as well as the crystallization promotive operation are automated by the computer. In this case, all operational factors including partial pressure of oxygen in the chamber, power of the microwave generator, substrate temperature, temperatures and shuttering order of evaporation sources during the film-forming operation are input previously in the computer and the following sequence is programmed in the computer:

(1) a film-forming operation in the MBE machine is interrupted temporally after predetermined numbers of constituent layers which correspond to one unit crystal or less than one unit crystal are layered, (2) output image signals from the analyzer is compared with image data of a known superconducting oxide stored in a memory of the computer, so that deposited constituent layers are left in an activated oxygen atmosphere, (3) next film-forming operation is not restarted until the output image signals from the analyzer become substantially identical with the image data stored in the memory, and (4) a combination of the film-forming operation and the crystallization promotion operation is repeated for desired times until a desired film thickness is obtained.

Now, the present invention is explained with referring to an attached drawing.

BRIEF DESCRIPTION OF THE DRAWING

FIG. 1 shows essential parts of a molecular beam epitaxy (MBE) machine which is used in the present invention. All details of a pressure sensor in the chamber, manipulators, evacuation pumps or the like are omitted for clarity and because they are well-known. The MBE machine shown in FIG. 1 has a chamber (1) which can be evacuated to a high vacuum, a plurality of evaporation cells (2) such as Knudsen Cells each containing an evaporation source (10) or an element to be evaporated which are heated adjustably to desired temperatures, shutters (8) each being actuated independently and in a predetermined order so that the amount of each atom beam evaporated from the evaporation cell (2) is controlled, a substrate holder (3) equipped with a heater (4) whose temperature is controllable, a pipe (6) for introducing active gas such as oxygen gas which is opened in the neighborhood of a surface of a substrate (5) on which a thin film is deposited, a microwave generator (7) for exiting the active gas in the pipe (6), and an analyzer for monitoring a crystal structure of the thin film on said substrate such as RHEED analyzer consisting of an electron gun (20) and a screen (21).

Figure 1:
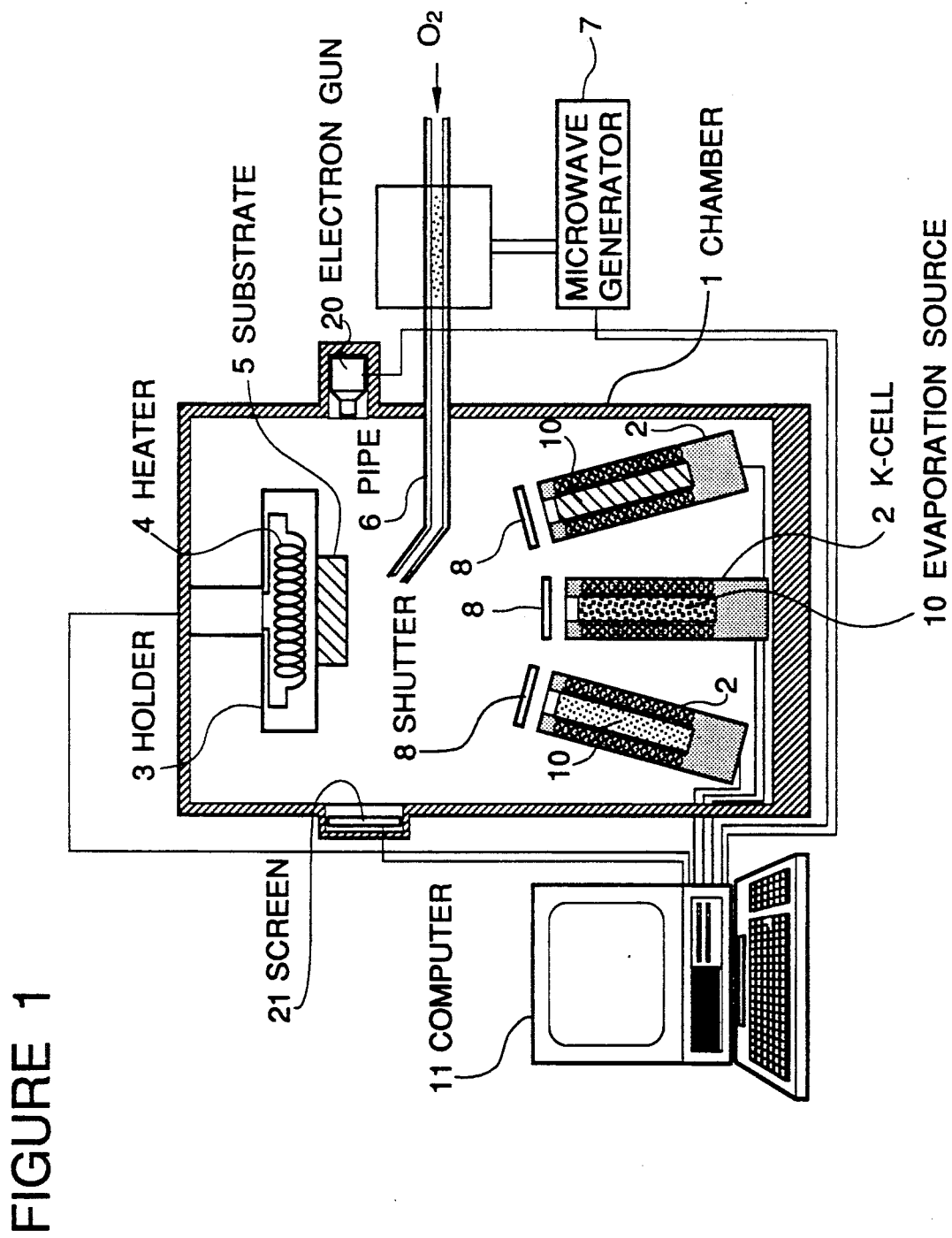
FIG. 1 illustrates a simplified MBE machine which is used for producing the compound oxide thin film according to the present invention.

The process according to the present invention can be carried out by operation the MBE machine manually. Followings are two examples of manual operation when thin films of superconducting oxides: $Y_1Ba_2Cu_3O_{7-z}$ and $Bi_4Sr_4Ca_4Cu_6O_{16+\delta}(=2Bi_2Sr_2Ca_2Cu_3O_{8+\delta/2})$ are prepared.

A layered superconducting oxide of $Y_1Ba_2Cu_3O_{7-z}$ has a unit crystal which consists of a Ba-O layer, a Cu-O layer, a Ba-O layer, a Cu-O layer, a Y-O layer, a Cu-O layer, a Ba-O layer, a Cu-O layer and a Ba-O layer stratified in this order. When a thin film of $Y_1Ba_2Cu_3O_{7-z}$ is deposited on a substrate by manual operation, beams of vapour sources (10) each being an elemental metal of Y, Ba and Cu heated in a respective K-cell (2) are directed to a substrate (5) in a predetermined order by shuttering respective shutters (8), while excited oxygen gas is supplied to a surface of the substrate from the pipe (6), so that the above-mentioned Ba-O layer, Cu-O layer, Ba-O layer, Cu-O layer, Y-O layer, Cu-O layer, Ba-O layer, Cu-O layer and Ba-O layer are deposited successively in this order. This stage is called "film-forming operation". According to the present invention, after lamination of one unit crystal complete, the film-forming operation is interrupted and a crystallization promotive operation is effected. In actual operation, all shutters (8) are closed and the constituent layers deposited are left in an atmosphere of oxygen gas which is supplied continuously through the pipe (6). During this crystallization promotive operation, rearrangement of elements or ordering of the crystal is realized. Timing of termination of the crystallization promotive operation can be detected by monitoring output signal of the reflection high energy electron diffraction (RHEED) analyzer. In the case of superconducting oxide of $Y_1Ba_2Cu_3O_{7-z}$, the crystallization promotive operation is terminated when a unique streak pattern caused by such a fact that the crystal has a longer lattice constant along b-axis than along a-axis is observed in the RHEED pattern. After the crystallization promotive operation complete, next film-forming operation is restarted. A combination of the film-forming operation and the crystallization promotion operation is repeated for desired times until a desired film thickness is obtained.

A layered superconducting oxide of $Bi_4Sr_4Ca_4Cu_6O_{16+\delta}(=2Bi_2Sr_2Ca_2Cu_3O_{8+\delta/2})$ has a half (½) unit crystal which consists of a Bi-O layer, a Sr-O layer, a Cu-O layer, a Ca-O layer, a Cu-O layer, a Ca-O layer, a Cu-O layer, a Sr-O layer and a Bi-O layer stratified in this order. One unit crystal is made by two of the half unit crystal which are deposited symmetrically. When a thin film of $Bi_4Sr_4Ca_4Cu_6O_{16+\delta}$ is deposited on a substrate by manual operation, it is preferable to carry out the crystallization promotion operation after half unit crystal is layered in the film-forming operation because numbers of constituent layers corresponding to one unit crystal are rather too lager to facilitate the ordering of crystal so that it is difficult to obtain a desired crystal structure composed mainly of a high-temperature phase of this superconducting oxide. In actual operation, beams of vapour sources (10) each being an elemental metal of Bi, Sr, Ca and Cu heated in a respective K-cell (2) (in this case the numbers of K-cells are increased to four) are directed to a substrate (5) in a predetermined order by shuttering respective shutters (8), while excited oxygen gas is supplied to a surface of the substrate from the pipe (6), so that the above-mentioned constituent layers of Bi-O layer, Sr-O layer, Cu-O layer, Ca-O layer, Cu-O layer, Ca-O layer, Cu-O layer, Sr-O layer and Bi-O layer which correspond to the half unit crystal are deposited successively in this order. According to the present invention, after lamination of half unit crystal complete, the film-forming operation is interrupted and a crystallization promotive operation is carried out by closing all shutters (8) and deposited constituent layers are left in an atmosphere of oxygen gas which is supplied continuously through the pipe (6). During this crystallization promotive operation, rearrangement of elements or ordering of the crystal is realized. Timing of termination of the crystallization promotive operation can be detected by monitoring output signal of the RHEED analyzer. In the case of superconducting oxide of $Bi_2Sr_2Ca_2Cu_3O_{8+\delta/2}$, the crystallization promotive operation is terminated when a specific modulation pattern which is unique to the high-temperature phase of this oxide is observed in the RHEED pattern. After the crystallization promotive operation complete, next film-forming operation is restarted. A combination of the film-forming operation and the crystallization promotion operation is repeated for desired times until a desired film thickness is obtained.

When the process according to the present invention is automated by the computer-aided system according to the present invention, the crystallization promotion operation is controlled by the computer (11) which is programmed as following:

(1) a pattern which is created by the electron gun (20) on a screen (21) is transformed into electric image signals by an image processor (not shown). The electric image signals are input in the computer (11) and are compared with known image data of an oxide concerned which are stored in the computer, (2) the deposited constituent layers are left in an activated oxygen atmosphere in order to effect a crystallization promotive operation until the electric image signals from the image processor become equal to the known image data, (3) after the electric image signals from the image processor become equal to the known image data, next film-forming operation is restarted, and (4) a combination of the film-forming operation and the crystallization promotion operation is repeated for desired times until a desired film thickness is obtained.

In a preferred embodiment of the system according to the invention, all sequence during the film-forming operation and the crystallization operation are proceeded according a program input in the computer (11). In this case, all operational parameters including a flow rate of oxygen gas (6), an energy of the microwave generator (7), temperature of the substrate heater (4), temperature of K-cells (2) and order and time duration of shutters (8) in the film-forming operation are memorized in the computer previously, so that all operations in the film-forming stage are carried out automatically under a control of the computer according to a programed feed-back control sequence which is well-known in the computer control system.

According to the present invention, thin films of oxide superconductors of high quality can be obtained owing to the crystallization promotion operation which is interposed between successive film-forming operations.

The process according to the present invention can be carried out in known MBE machine without changing the machine and is advantageously operated automated condition by using a computer.

Now, examples of the present invention will be shown but the present invention should not be limited to the special examples.

EXAMPLE 1

A thin film of $YBa_2Cu_3O_{7-z}$ was deposited on a {100} plane of a single crystal of MgO according to the process of the present invention in the MBE machine shown in FIG. 1. In this example, the computer (11) was not used but the operation was carried out in manual control.

Oxygen gas was exited by the microwave generator (7) and was supplied from the pipe (6) in the neighborhood of a surface of the MgO substrate (5). K-cells (2) each containing elemental metals of Y, Ba and Cu were heated to temperatures of 1,450° C. for Y, 500° C. for Ba and 1,080° C. for Cu. After then, a film-forming operation was started.

In the film-forming operation, after the chamber (1) was evacuated to a pressure of $5 \times 10^{-6}$ Torr and the substrate (5) was heated to a temperature of 650° C. shutters (8) were opened in an order of Ba, Cu, Ba, Cu, Y, Cu, Ba, Cu and Ba to deposit constituent layers corresponding to one unit crystal. Shutters were opened for 4 sec in Y, for 3 sec in Ba and for 5 sec in Cu respectively.

Then, a crystallization promotive operation was carried out by monitoring the RHEED analyzer. During the crystallization promotive operation, the pressure in the chamber and the substrate temperature was maintained at the same values as those of the film-forming operation, namely $5 \times 10^{-6}$ Torr and 650° C. until an a-axis became shorter than b-axis in a RHEED pattern.

After this condition was realized, the film-forming operation was restarted. Then, a combination of the film-forming operation and the crystallization promotive operation was repeated until a desired film thickness of 100 nm was obtained.

For comparison, the film-forming operation alone was repeated without interposing the crystallization promotive operation of the present invention to prepare a thin film of 100 nm thick according to know process. Film forming speed of the comparative example was 0.5 Å/sec.

Common conditions to the present invention and the comparative example are as following:
Substrate temperature: 650° C.
Pressure in the chamber: $5 \times 10^{-6}$ Torr
Flow rate of activated oxygen: 0.5 SCCM
Pressure in the oxygen supply pipe at the microwave discharge zone: 0.5 Torr Superconducting properties (Tc=critical temperature, Jc=critical current density) of thin films obtained are summarized in Table 1.

TABLE 1

|  | Power of microwave (W) | Tc (K) | Jc* (A/cm$^2$) | Appearance of surface |
| --- | --- | --- | --- | --- |
| Invention | 150 | 88 | $2.4 \times 10^6$ | smooth |
| Comparative | 150 | 82 | $0.9 \times 10^4$ | uneven |

*determined at 77K

The result revealed that the thin film prepared by the process according to the present invention is improved in surface condition and in crystallinity and hence is of high quality.

EXAMPLE 2

Example 1 was repeated to prepare a thin film of $YBa_2Cu_3O_{7-z}$ on a {100} plane of a single crystal of MgO in the MBE machine shown in FIG. 1, but, in this example, all operations were programed in the computer (11) in which the following data were input previously:

Film-Forming Operation

Temperature of K-cells: Y=1,450° C., Ba=500° C., Cu=1,080° C.
Shuttering order: Ba, Cu, Ba, Cu, Y, Cu, Ba, Cu and Ba
Shuttering time duration: Y=4 sec, Ba=3 sec, Cu=5 sec.
Pressure in the chamber: $5 \times 10^{-6}$ Torr
Substrate temperature: 650° C.
Flow rate of activated oxygen: 0.5 SCCM
Pressure in the oxygen supply pipe at the microwave discharge zone: 0.5 Torr
Film thickness: 100 nm

Crystallization Promotive Operation

Pressure in the chamber: $5 \times 10^{-6}$ Torr
Substrate temperature: 650° C.
Flow rate of activated oxygen: 0.5 SCCM
Pressure in the oxygen supply pipe at the microwave discharge zone: 0.5 Torr
RHEED pattern data: A streak pattern of known crystal structure of $YBa_2Cu_3O_{7-z}$ was converted to digital image data The film-forming operation was carried out automatically according to the program. In the crystallization promotive operation, the computer (11) was programmed such a manner that output signals of the RHEED analyzer were processed by an image processor to produce image data which were compared with the streak pattern data of known superconducting oxide of $Y_1Ba_2Cu_3O_{7-z}$ stored in the computer (11) and that timing of termination of the crystallization promotive operation was determined when both data became substantially identical, more precisely when distances of a-axis and distances of b-axis became identical.

The result of superconducting properties of thin film obtained are summarized in Table 2.

TABLE 2

| Reaction Gas | Power of microwave (W) | Tc (K) | Jc* (A/cm$^2$) |
|---|---|---|---|
| Oxygen | 150 | 88 | $2.4 \times 10^6$ |

*determined at 77K

The thin film obtained showed improved surface condition and crystallinity and hence was of high quality.

EXAMPLE 3

A thin film of $Bi_2Sr_2Ca_2Cu_3O_{8+\delta/2}$ was deposited on a {100} plane of a single crystal of MgO according to the process of the present invention in the same MBE machine as FIG. 1, but numbers of K-cells (2) were increased to four. In this example, the computer (11) was not used but the operation was carried out in manual control.

Oxygen gas was exited by the microwave generator (7) and was supplied from the pipe (6) in the neighborhood of a surface of the MgO substrate (5). K-cells (2) each containing elemental metals of Bi, Sr, Ca and Cu were heated to temperatures of 530° C. for Bi, 500° C. for Sr, 520° C. for Ca and 1,100° C. for Cu. After then, a film-forming operation was started.

In the film-forming operation, after the chamber (1) was evacuated to a pressure of $5 \times 10^{-6}$ Torr and the substrate (5) was heated to a temperature of 650° C., shutters (8) were opened in an order of Bi, Sr, Cu, Ca, Cu, Ca, Cu, Sr and Bi to deposit constituent layers corresponding to a half unit crystal. Shutters were opened for 2 sec in Bi, for 3 sec in Sr, for 4 sec in Ca and for 3 sec in Cu respectively.

After constituent layers corresponding to a half unit crystal was layered, a crystallization promotive operation was carried out by monitoring the RHEED analyzer. During the crystallization promotive operation, the pressure in the chamber and the substrate temperature were maintained at the same values as those of the film-forming operation, namely $5 \times 10^{-6}$ Torr and 650° C. until a specific modulated RHEED pattern which is unique to the crystal of $Bi_2Sr_2Ca_2Cu_3O_{8+d/2}$ was observed on a monitor.

After this condition was realized, next film-forming operation was restarted. Then, a combination of the film-forming operation and the crystallization promotive operation was repeated until a desired film thickness of 100 nm was obtained.

For comparison, the film-forming operation alone was repeated without interposing the crystallization promotive operation of the present invention to prepare a thin film of 100 nm thick according to know process. Film forming speed of the comparative example was 0.5 Å/sec.

Common conditions to the present invention and the comparative example were as following:
Substrate temperature: 650° C.
Pressure in the chamber: $5 \times 10^{-6}$ Torr
Flow rate of activated oxygen: 0.5 SCCM
Pressure in the oxygen supply pipe at the microwave discharge zone: 0.5 Torr Superconducting properties (Tc, Jc) of thin films obtained are summarized in Table 3.

TABLE 3

| | Power of microwave (W) | Tc (K) | Jc* (A/cm$^2$) | Appearance of surface |
|---|---|---|---|---|
| Invention | 150 | 108 | $2.8 \times 10^6$ | smooth |
| Comparative | 150 | 92 | $0.9 \times 10^4$ | uneven |

*determined at 77K

The result revealed that the thin film prepared by the process according to the present invention is improved in surface condition and in crystallinity and hence is of high quality.

EXAMPLE 4

Example 3 was repeated to prepare a thin film of $Bi_2Sr_2Ca_2Cu_3O_{8+d/2}$ on a {100} plane of a single crystal of MgO in the same MBE machine as FIG. 1, but the numbers of K-cells were increased to four and all operations were programed in the computer (11) to which the following data were input previously:

Film-Forming Operation

Temperature of K-cells: Bi=530° C., Sr=500° C., Ca=520° C., Ca=1,100° C.
Shuttering order: Bi, Sr, Cu, Ca, Cu, Ca, Cu, Sr and Bi (=numbers of constituent layers corresponding to a half unit crystal)
Shuttering time duration: Bi=2 sec, Sr=3 sec, Ca=4 sec, Cu=3 sec.
Pressure in the chamber: $5 \times 10^{-6}$ Torr
Substrate temperature: 650° C.
Flow rate of activated oxygen: 0.5 SCCM
Pressure in the oxygen supply pipe at the microwave discharge zone: 0.5 Torr
Film thickness: 100 nm Crystallization Promotive Operation Pressure in the chamber: $5 \times 10^{-6}$ Torr
Substrate temperature: 650° C.
Flow rate of activated oxygen: 0.5 SCCM
Pressure in the oxygen supply pipe at the microwave discharge zone: 0.5 Torr
RHEED pattern data: A streak pattern of known crystal structure of $Bi_2Sr_2Ca_2Cu_3O_{8+d/2}$ was converted to digital image data The film-forming operation was carried out automatically according to the program. In the crystallization promotive operation, the computer (11) was programmed such a sequence that output signals of the RHEED analyzer were processed in an image processor to produce image data which were then compared with the streak pattern data of known superconducting oxide of $Bi_2Sr_2Ca_2Cu_3O_{8+d/2}$ stored in the computer (11) and that the crystallization promotive operation was terminated when both data became identical, more precisely when a specific modulated pattern which is unique to the crystal of $Bi_2Sr_2Ca_2Cu_3O_{8+d/2}$ was obtained in the RHEED.

The result of superconducting properties of thin film obtained are summarized in Table 4.

TABLE 4

| Reaction Gas | Power of microwave (W) | Tc (K) | Jc* (A/cm$^2$) |
|---|---|---|---|
| Oxygen | 150 | 108 | $2.8 \times 10^6$ |

*determined at 77K

The thin film obtained showed improved surface condition and crystallinity and hence was of high quality.

What is claimed is:

1. A system for depositing a thin film of oxide superconductor having a layered crystal structure on a substrate by a molecular beam epitaxy (MBE) machine comprising a chamber in which a high vacuum can be created, means for introducing oxygen gas into said chamber, a microwave generator for exiting the oxygen gas, means for heating said substrate positioned in said chamber, means for controlling independently temperatures of evaporation sources, means for controlling independently shutters for said evaporation sources, and an analyzer for monitoring crystal structures of thin films deposited on said substrate, characterized in that output image signals from the analyzer (20, 21) for monitoring crystal structures of a thin film deposited on the substrate (5) is compared with image data of a known superconducting oxide stored in a memory of a computer (11) so that a crystallization promotive operation of the thin film deposited on the substrate (5) is effected in an oxygen gas atmosphere and that next film-forming operation is restarted after the output image signals from the analyzer become substantially identical with the image data stored in the memory.

2. The system set forth in claim 1 wherein said analyzer (20, 21) is a reflection high-energy electron diffraction (RHEED) analyzer.

3. The system set forth in claim 2 wherein said crystallization promotive operation is terminated when a desired pattern is observed in the RHEED analyzer.

4. The system set forth in claim 3 wherein said desired pattern in the RHEED analyzer is a modulated pattern which is inherent to an oxide superconductor to be obtained.

5. The system set forth in claim 3 wherein said desired pattern in the RHEED analyzer is a predetermined streak pattern which is inherent to an oxide superconductor to be obtained.

6. The system set forth in claim 2 wherein the output image signals from the RHEED analyzer are converted to digital image data by an image processor and the digital image data are compared with image data of known crystal structures of a superconducting oxide stored in a memory in the computer.

7. The system set forth in claim 2 wherein at least one of operational factors selected from the group comprising partial pressure of oxygen in the chamber and substrate temperature is modified during the crystallization promotive operation.

8. The system set forth in claim 1 wherein both of the film-forming operation and the crystallization promotive operation are automated by the computer in which all operational factors including partial pressure of oxygen in the chamber, power of the microwave generator, substrate temperature, temperatures and shuttering order and time duration of evaporation sources during the film-forming operation are input previously and which is programmed as following:

(1) a film-forming operation in the MBE machine is interrupted temporally after predetermined numbers of constituent layers which correspond to one unit crystal or less than one unit crystal are layered, (2) output image signals from the analyzer is compared with image data of a known superconducting oxide stored in a memory of the computer, so that deposited constituent layers are left in an activated oxygen atmosphere, (3) next film-forming operation is not restarted until the output image signals from the analyzer become substantially identical with the image data stored in the memory, and (4) a combination of the film-forming operation and the crystallization promotion operation is repeated for desired times until a desired film thickness is obtained.

* * * * *